Figure 1:
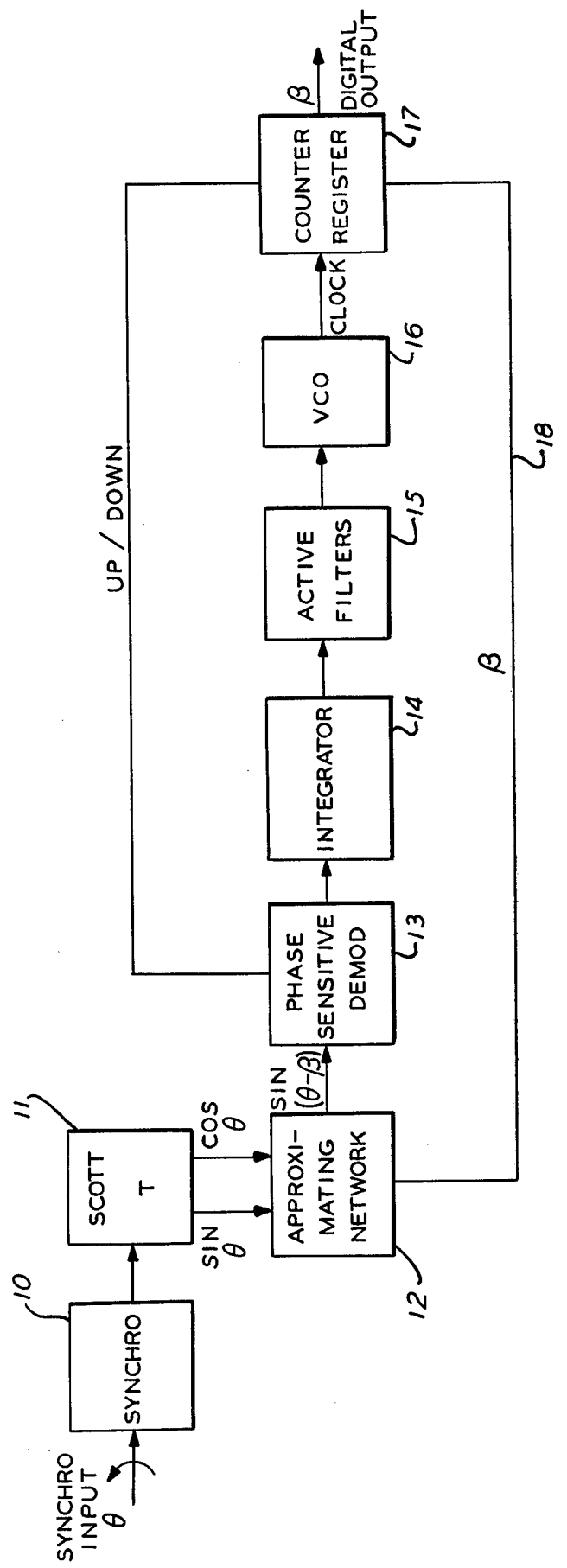

United States Patent [19]

Simon et al.

[11] 4,119,958
[45] Oct. 10, 1978

[54] METHOD FOR ACHIEVING HIGH ACCURACY PERFORMANCE FROM CONVENTIONAL TRACKING SYNCHRO TO DIGITAL CONVERTER

[75] Inventors: David Julian Simon, Saddle Brook, N.J.; Alfred Douglas Gronner, White Plains, N.Y.; Carl Cono Stella, Valencia, Calif.

[73] Assignee: The Singer Company, Little Falls, N.J.

[21] Appl. No.: 625,215

[22] Filed: Oct. 23, 1975

[51] Int. Cl.² .......................................... H03K 13/02
[52] U.S. Cl. ............................ 340/347 SY; 318/604; 340/347 M
[58] Field of Search ................ 340/347 AD, 347 SY, 340/347 CC; 235/197; 318/632, 604; 71/1 E

[56] References Cited

U.S. PATENT DOCUMENTS

| 3,555,254 | 1/1971 | Gerber | 318/632 X |
| 3,641,565 | 2/1972 | Ivers et al. | 340/347 SY |
| 3,668,693 | 6/1972 | Eaton et al. | 340/347 SY |
| 3,705,400 | 12/1972 | Cordes | 340/347 P X |
| 3,855,466 | 12/1974 | Schwarz | 324/99 D X |
| 3,898,648 | 8/1975 | Gariazzo | 340/347 AD X |
| 3,906,324 | 9/1975 | Smith | 318/571 X |
| 3,911,347 | 10/1975 | Hartung | 318/632 |
| 3,917,930 | 11/1975 | Davey et al. | 318/632 |
| 3,976,983 | 8/1976 | Moussie | 340/173 SP |
| 4,001,557 | 1/1977 | Stephenson | 432/51 X |

OTHER PUBLICATIONS

Analog Devices, Inc., "Analog-Digital Conversion Handbook," pp. I-23 to I-26, 6/1972.

*Primary Examiner*—Thomas J. Sloyan
*Attorney, Agent, or Firm*—Laurence A. Wright; Thomas W. Kennedy

[57] ABSTRACT

A synchro to digital converter which has a programmable read only memory (prom) that operates under control of a feed back counter and register. The prom is programmed to generate a digital signal proportional to the converter's inherent systematic error. The data stored in the prom is empirically derived by running an error (input angle vs. output angle) curve on the uncompensated converter. The corrected error signal from the prom is converted to analog form by conventional digital to analog converter means and subtracted from the closed loop steering signal which is derived from an approximating network thereby increasing the converter output accuracy to within better than 2 arc minutes.

3 Claims, 2 Drawing Figures

4,119,958

METHOD FOR ACHIEVING HIGH ACCURACY PERFORMANCE FROM CONVENTIONAL TRACKING SYNCHRO TO DIGITAL CONVERTER

This invention is related to analog to digital converters. More particularly, this invention is related to a high accuracy synchro to digital tracking converter having means to compensate for the inherent systematic converter error.

BACKGROUND OF THE INVENTION

Synchros and resolvers, as well known in the art, are rotating devices which provide angular information used in computer systems. These devices generate alternating current analog signals representing the sine and cosine of an angle. The synchro transformer comprises a wye shaped primary winding or stator and a moveable single secondary winding or rotor. The angular displacement between the primary and secondary windings of the synchro transformer provides alternating current analog output signals whose amplitudes represent the sine and cosine of the angles between the primary and the secondary windings.

Tracking synchro to digital techniques usually involve tradeoffs between component count, cost and accuracy. For example, multispeed devices while effective in achieving higher accuracy require more than one sensor and expensive associated gearing mechanism. Additional interface wires and a greater number of electronic parts required to prevent ambiguities in conversion by multi speed devices are also disadvantages. Another example is precision solid state converters which have inherent accuracy that is achieved at great cost and large volume. The desired result is to achieve high accuracy with minimum cost and component count.

The purpose of this invention is to provide means for substantial enhancement of precision in converting from synchro to digital form utilizing fewer discrete parts than required by conventional means by utilizing a novel error compensating technique. This technique enables structure of a compact, low cost converter with accuracy better than two arc minutes. It is understood that the error compensating technique disclosed herein is applicable to the analog to digital converters generally and is not limited solely to synchro to digital converters.

BREIF DESCRIPTION OF THE INVENTION

The present invention comprises a synchro to digital converter which has a programmable read only memory (prom) that operates under control of a feedback counter and register. The prom is in a loop comprising the prom, a digital to analog converter and a buffer. The data that is stored in the prom is empirically derived by plotting an error curve on the uncompensated converter. The prom is then programmed with this data to generate a digital signal proportional to the converter's inherent systematic error. The digital output error signal from the prom is converted to analog form by the digital to analog converter and subtracted from the closed loop steering analog signal in this manner, increasing converter accuracy and reducing the converter error principally to time and temperature effects. The steering loop comprises the approximating network which provides an analog error signal representing the difference between analog input angle $\theta$ and digital output angle $\beta$, a summing network which subtracts the error signal $\sin(\theta-\beta)$ from the signal derived from the prom loop, the phase sensitive demodulator, the integrator, the voltage controlled oscillator and the counter and register which provides a digital angular output.

Accordingly, it is an object of this invention to provide an analog-to-digital converter utilizing fewer discrete parts than required by conventional means.

It is a further object of this invention to provide an analog-to-digital converter having a programmable read-only memory which is capable of issuing digital correction commands which vary as a function of the input angle.

Figure 2:
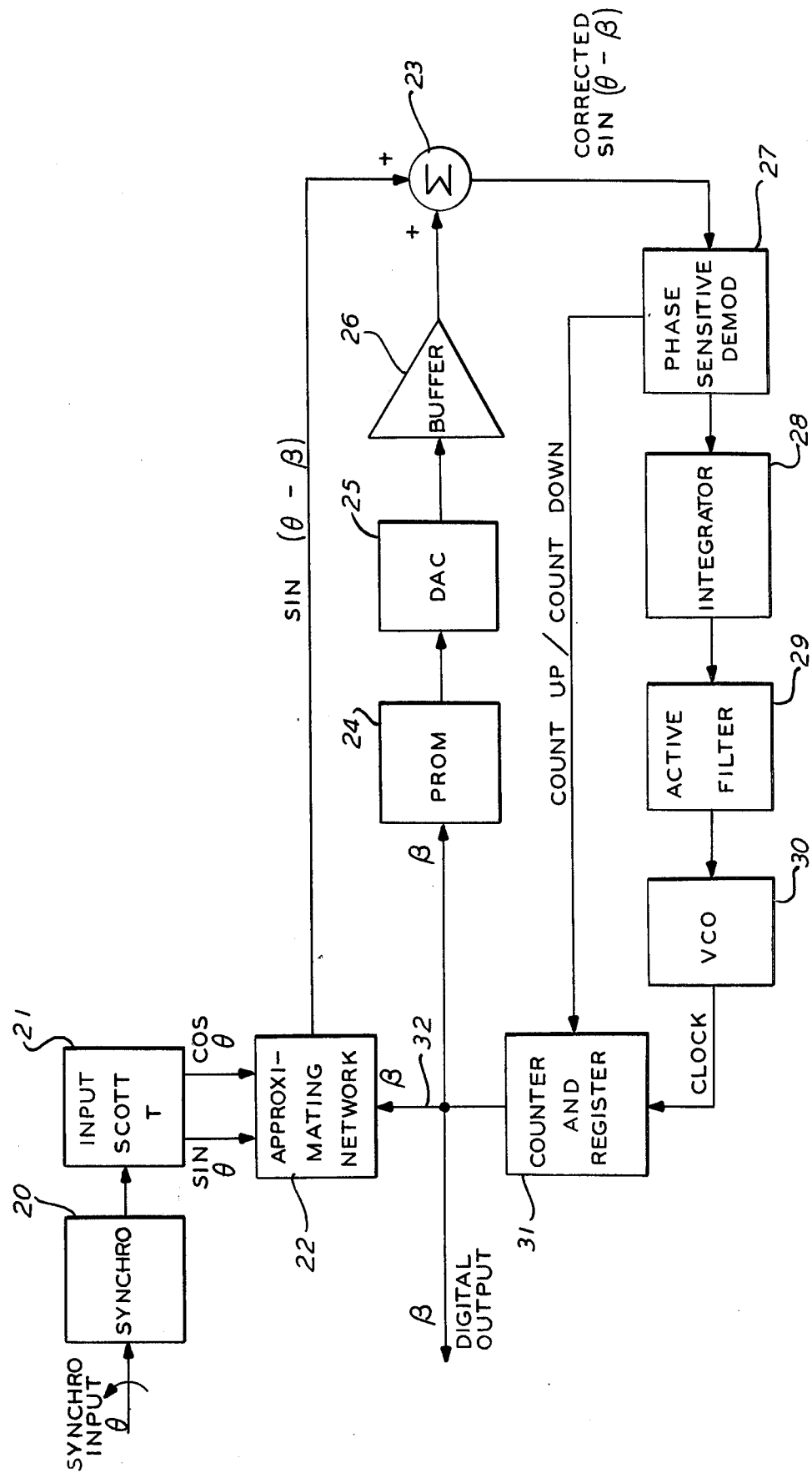

These and other objects and additional advantages of the invention will be more readily understood by those skilled in the art after consideration of the following detailed description taken in conjunction with the accompanying drawings wherein:

FIG. 1 is a block diagram of a typical prior art synchro to digital converter; and FIG. 2 is a block diagram showing the improved synchro to digital converter of the invention.

Referring to FIG. 1, there is shown a block diagram of a typical prior art synchro converter which does not provide the desired degree of accuracy as the invention. By rotating the shaft of synchro transformer 10 through an angle $\theta$ three output signals are obtained on $S_1$, $S_2$ and $S_3$ terminals (not shown) of the stator windings of the synchro 10. These signals are applied to the Scott "T",11 which is in essence a transformer device having three wire inputs and four wire outputs or vice versa and is well known in the art. From the Scott "T" two signals are obtained one representing the sine $\theta$ function and the other representing the cosine $\theta$ function. The approximating network 12 approximates sine $\theta$ and cosine $\theta$ input functions with chords, i.e., straight line approximations are made of the non-linear sine and cosine functions. In the approximating network 12, the approximated sine $\theta$ and cosine $\theta$ signals are combined with the digital signal $\beta$ to produce a difference signal $\sin(\theta-\beta)$. The straight line approximation technique of non-linear functions is discussed in detail in U.S. pat. No. 3,071,324, issued Jan. 1, 1963 and in U.S. pat. No. 3,277,464, issued Dec. 19, 1963. The difference signal $\sin(\theta-\beta)$ is applied to phase sensitive demodulator 13 where phase detection takes place.

A count up or count down signal is generated at the output of the phase sensitive demodulator depending upon the phase of the error signal input. An output from the phase sensitive demodulator is applied to the integrator 14 and to the counter-register 17. In the integrator 14 the signal is shaped and then filtered in active filters block 15. From block 15 the signal is applied to the voltage control oscillator 16 where clock pulses are generated for application to counter and register block 17. The clock pulse input to the counter and register determines the speed with which the counter counts and the up/down signal input to the counter and register determines whether the count should be up or down in order to follow the input synchro signal. The feedback line 18 to approximating network 12 provides digital output $(\beta)$ signals for use in generating the difference signal $\sin(\theta-\beta)$. The same digital output $(\beta)$ signal from counter and register 17 is employed in further processing by apparatus utilizing the converter.

Implicit in tracking converters is a means whereby an error voltage equivalent to $\sin(\theta-\beta)$ is generated where θ is equal to the input synchro angle and β is equal to the digital output angle. Whenever this angle is nulled, the difference between θ and β is a measure of the accuracy of the conversion technique. As stated above, the conversion technique employed in this invention approximates sine and cosine function with chords by means of straight line approximations of non-linear sine θ and cosine functions. The inherent accuracy of this approximation is a function of chord length. In the present invention, 22.5° chords were used, with peak inherent errors of 3.3 arc minutes. Errors from other sources limit overall end converter accuracy to 5.5 arc minutes.

The digital compensation technique of this invention provides means for summing a correction voltage with the error voltage sine $(\theta - \beta)$, which minimizes the difference between angles θ and β at null. By definition, this makes the end item accuracy better. The errors which must be compensated change as a function of angle, therefore, the correction voltage must also be changed versus angle.

An error curve is run on an uncompensated converter unit and the emperical data obtained is then stored in a "programmable read-only memory" or "prom". The prom is then capable of issuing digital correction commands which vary as a function of input angle. Thus, specific variable correction voltages can be derived to compensate for specifically variating errors of any converter.

If it were practical to take an infinite number of points along an error curve and store that information in a prom, it would be theoretically possible to perfectly compensate a converter so that it would have no errors at all. Practical requirements limit data points to be taken every 0.7031° for the range 0° to 180°. These 256 data points suffice for the full 360° if care is taken that any error be symmetrical at a point 180° away. The finite steps of 0.7036° also means that since the error may well be different at various increments within the step, the average error is used. If the error is not smooth, i.e., has a step function at a quadrant point, care must be exercised that the average errors used at either side of the step changes, neither overlaps (which would create stability problems) nor allows an accumulated error larger than the end item requirements. The circuits needed to accomplish the compensation technique are a prom, a monolithic digital-to-analog converter and a buffer amplifier.

For the most part, the block diagram of FIG. 2 to be discussed immediately following, represents standard circuit blocks well known to those skilled in the art. A more detailed discussion of these circuit blocks can be found in U.S. pat. No. 3,668,693, issued June 6, 1972, to the same assignee as the present application.

Turning now to FIG. 2, there is shown a block diagram of the improved synchro to digital converter of the invention. The rotation of synchro 20 provides three input signals from the stator windings $S_1$, $S_2$ and $S_3$ (not shown) of synchro 20 to Scott "T" block 21. The Scott "T" provides outputs representing sin θ and cosine θ to approximation network 22. The approximation technique performed by block 22 is the same as discussed with regard to FIG. 1 above. In the approximating network 22 straight line approximations are made of non-linear sine θ and cosine θ functions combining these signals with digital output signal β to generate an error or difference voltage sin $(\theta - \beta)$. When this error is nulled the difference between θ and β is a measure of the accuracy of the conversion technique. The error signal sin $(\theta - \beta)$ is then applied to a summing network 23. Also applied to summing network 23 is a digital error signal which is proportional to the converter's inherent systematic error. This signal is derived by way of the prom 24, the digital to analog converter 25 and buffer 26. The prom 24 has stored in it data representing an error curve (input angle versus output angle) which has been previously plotted on the unit. In other words, 256 data points taken every 0.7031° for the range 0° to 180° are plotted to arrive at the error curve for the uncompensated converter unit. Since the curve is symmetrical the same data points are used for angles 180° away thus providing for the full 360°. The prom 24 also receives the signals, β from counter and register 31. In prom 24, β addresses the stored data and the output digital error signal is applied to digital to analog converter 25. The error signal is converted to analog form by conventional means and sent by buffer amplifier 26 to summing network 23 where it is combined with the closed loop steering difference signal sin $(\theta - \beta)$. The corrected signal so obtained is then applied to the phase sensitive demodulator 27 where the signal phase is detected. One output of the phase sensitive demodulator is a count up or count down signal for application to the counter register 31. The sense of the signal to register 31 from the phase sensitive demodulator is determined by the phase of the signal input to it. The other output from the phase sensitive demodulator is applied to the integrator 28. In the integrator 28 the signal is shaped and applied to active filter 29 where it is filtered and applied to voltage controlled oscillator 30. The voltage controlled oscillator converts the dc voltage signal input into frequency. The output of the voltage controlled oscillator 15 are clock pulses which are applied to the counter and register 31 to determine the speed with which the counter counts. On the other hand, the count up/count down signal input to the counter and register determines whether the count should be up or down in order to follow the input synchro signal. The feedback line 32 to approximating network 22 provides digital output signal β for use in generating the difference signal sin $(\theta - \beta)$. If the register is low as compared to input synchro signals, count up pulses are applied to the counter and register. Count down pulses from phase sensitive demodulator 27 are applied to the counter and register if it is high. Thus, the output digital angle β is made to more closely follow the input angle θ.

It is believed apparent that many changes could be made in the construction and described uses of the foregoing synchro to digital converter and many seemingly different embodiments of the invention could be constructed without departing from the scope thereof. Accordingly, it is intended that all matter contained in the above description or shown in the accompanying drawings shall be interpreted as illustrative and not in a limiting sense.

What is claimed is:

1. A synchro to digital converter having means to compensate for the inherent systematic converter error comprising;
    a source of input synchro analog signals;
    means for converting said input synchro analog signals to digital signals;
    means for deriving a first analog error signal representing the difference between said input synchro analog signals and the analog equivalent of said digital signals by approximating the synchro input signals with straight line approximations of non-linear sine and cosine functions;

means for storing digital signals representative of the inherent systematic error and means for generating a second analog error signal representative of said stored digital signals; and means for combining said second error signal with said derived first error signal to correct for output error.

2. In an analog to digital converter comprising:
 (a) input means for coupling to a source of analog signals; and
 (b) means for converting the analog signals to digital output signals, said converting means including means for deriving an analog error signal representing the difference between the analog input and digital output signals, means to compensate for output error comprising:
 (c) means for storing the inherent systematic error of said converter and combining said inherent error with said derived error signal to correct for output error and enhance output accuracy
wherein said means for storing and combining comprise a programmable read-only memory for storing the inherent systematic error of said converter and for generating a digital signal, means to convert said digital signal to analog correction signal and means to combine said analog correction signal with said derived error signal whereby the output error of said converter is reduced.

3. In an analog synchro to digital converter of the type in which the output digital angle signal is subtracted from the input analog signal to develop an error signal to adjust the digital angle signal so as to null the error, a method of obtaining more accurate digital output signals comprising:
 a) measuring for each of a plurality of incremental output signals the error between the input angle at the synchro shaft and the digital output angle;
 b) storing signals representative of said errors in a programmable read-only memory;
 c) coupling the address inputs of said programmable read-only memory to the digital output angle signal;
 d) converting the output of said programmable read-only memory to an analog signal; and
 e) subtracting said converted programmable read-only memory output signal from said converter error signal.

* * * * *